(12) United States Patent
Ishikawa

(10) Patent No.: US 6,398,475 B1
(45) Date of Patent: Jun. 4, 2002

(54) CONTAINER

(75) Inventor: Toshio Ishikawa, Tokyo (JP)

(73) Assignee: Dainichi Shoji Kabushiki Kaisha, Tokyo (JP)

(*) Notice: Subject to any disclaimer, the term of this patent is extended or adjusted under 35 U.S.C. 154(b) by 0 days.

(21) Appl. No.: 09/627,508
(22) PCT Filed: Dec. 2, 1998
(86) PCT No.: PCT/JP98/05417
§ 371 (c)(1),
(2), (4) Date: Jul. 28, 2001
(87) PCT Pub. No.: WO00/33376
PCT Pub. Date: Jun. 8, 2000

(51) Int. Cl.⁷ .......................... B65G 49/07; H01L 21/68
(52) U.S. Cl. ................ 414/217; 414/217.1; 414/939; 206/710; 206/711
(58) Field of Search .................. 414/217, 217.1, 414/939; 206/710, 711

(56) References Cited

U.S. PATENT DOCUMENTS

| 5,772,386 A | 6/1998 | Mages et al. |
| 5,980,195 A | 11/1999 | Miyashita |
| 6,071,059 A | 6/2000 | Mages et al. |

FOREIGN PATENT DOCUMENTS

| JP | 8-279546 | 10/1996 |
| JP | 9-306975 | 11/1997 |

*Primary Examiner*—Steven A. Bratlie
(74) *Attorney, Agent, or Firm*—Knobbe, Martens, Olson & Bear, LLP

(57) ABSTRACT

A container for receiving and transporting dust free articles which is opened and closed by inserting a positioning pin and a key in an opener mechanism into a positioning hole and a key hole provided in a cover, with a tapered surface formed on an upper inner surface of the positioning hole, and with a floating mechanism disposed in the key hole. According to the above container, the positioning pin and key are easily inserted, and the cover is smoothly closed.

13 Claims, 14 Drawing Sheets

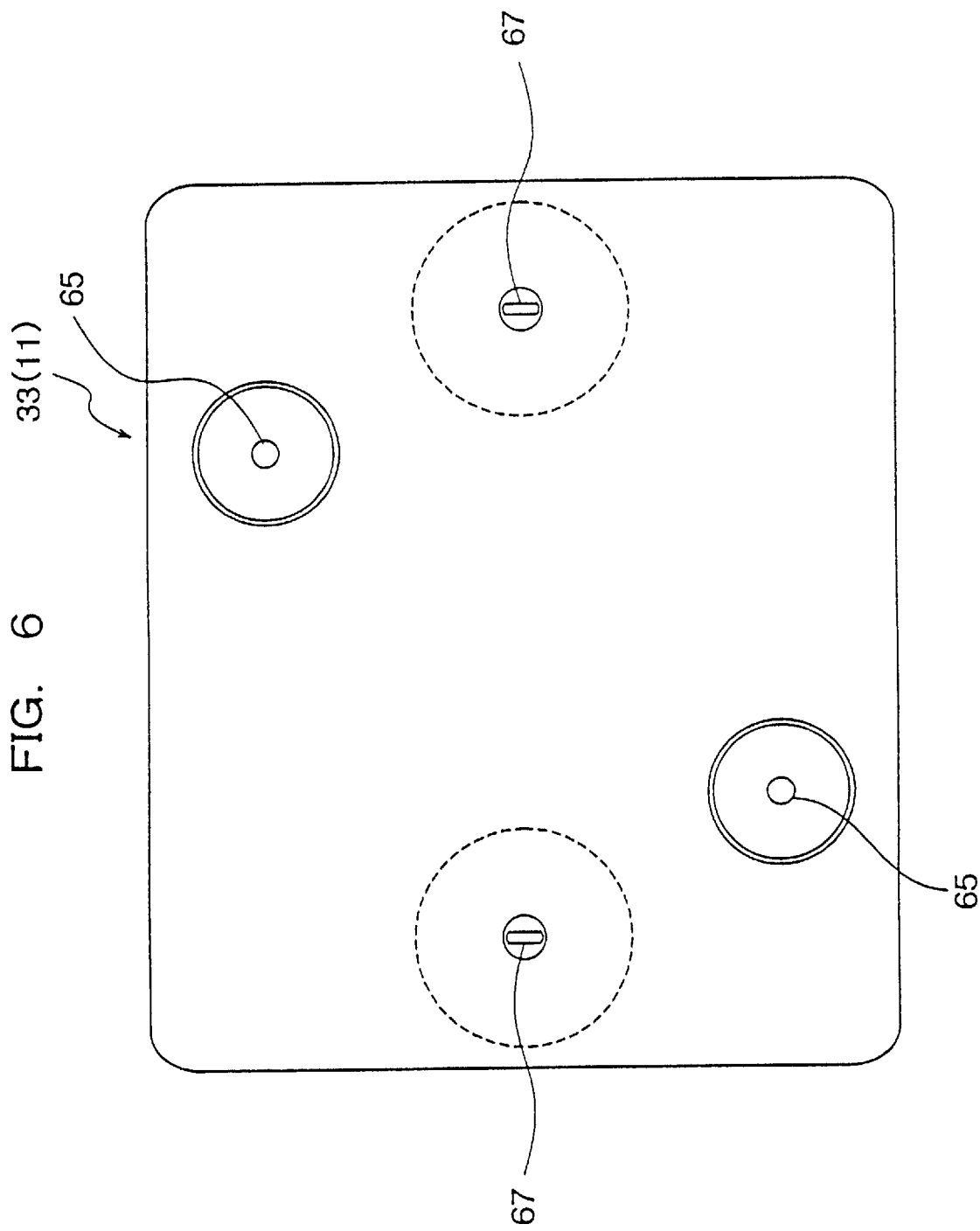

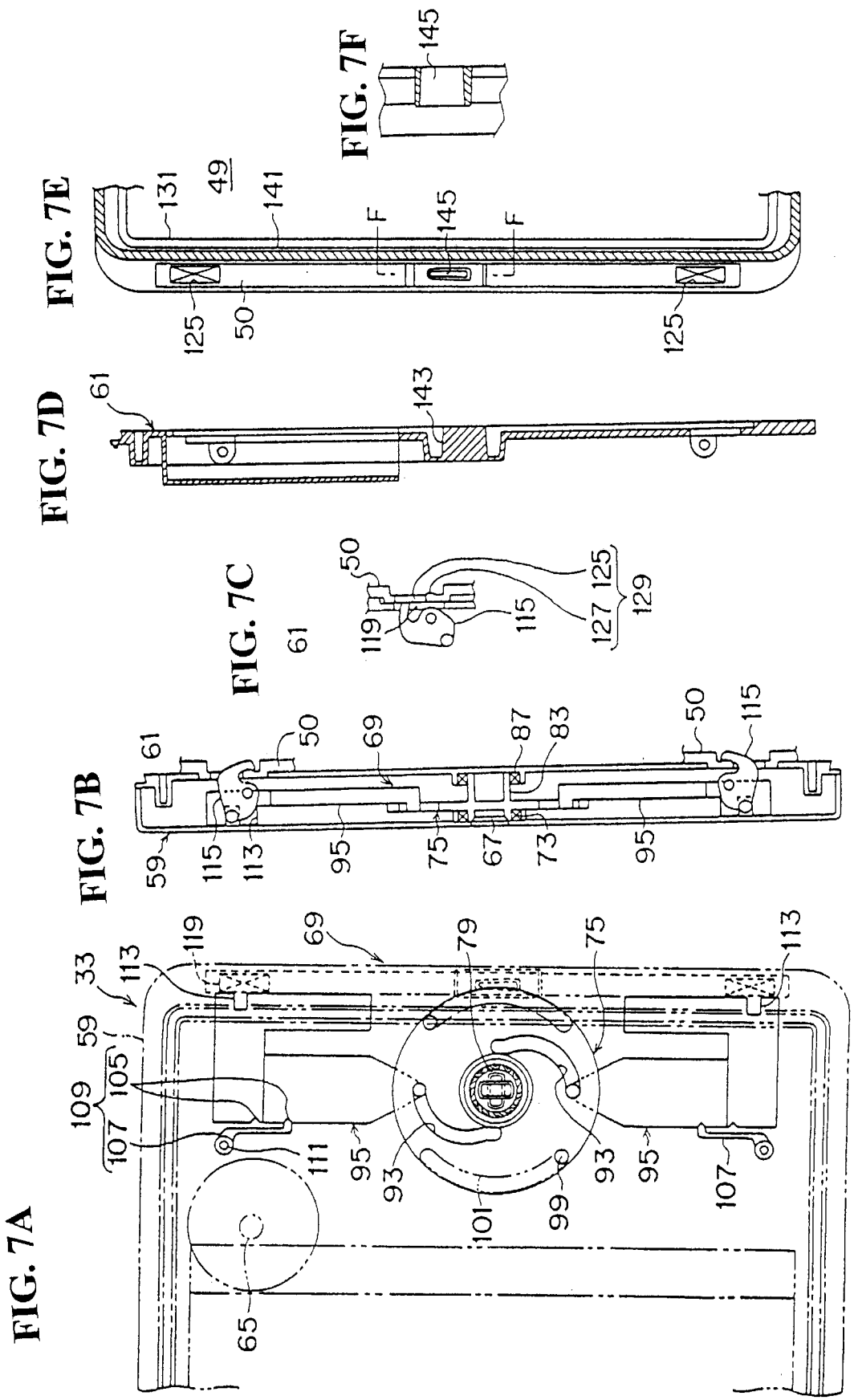

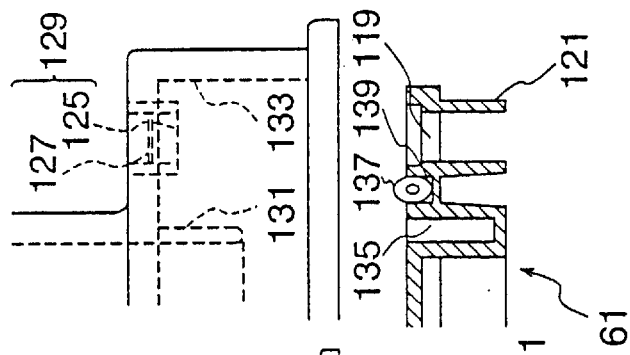
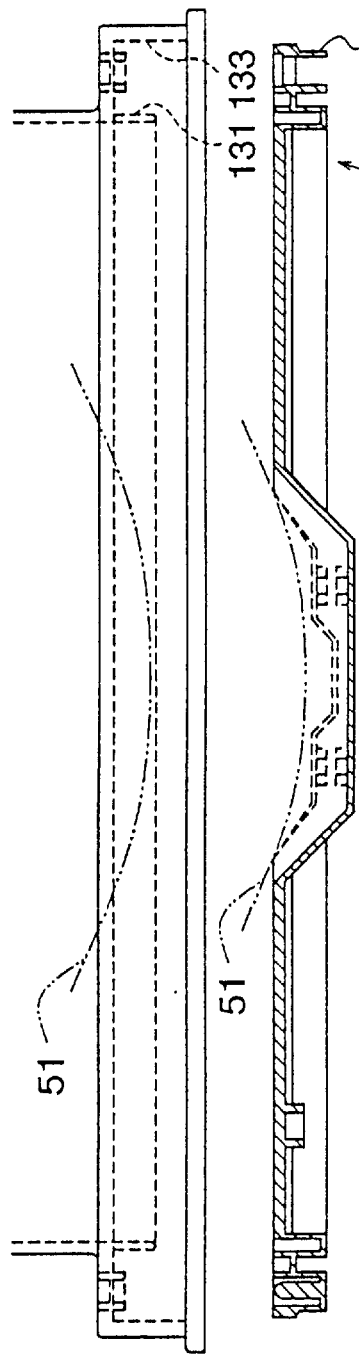

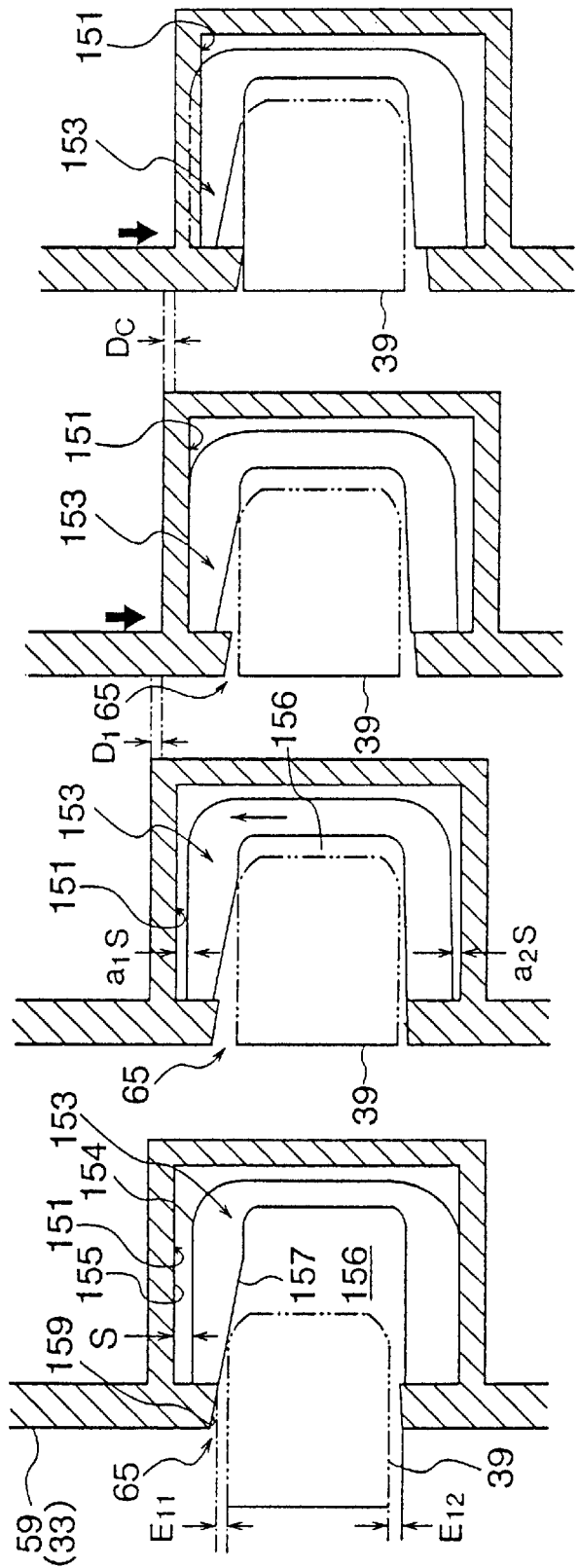

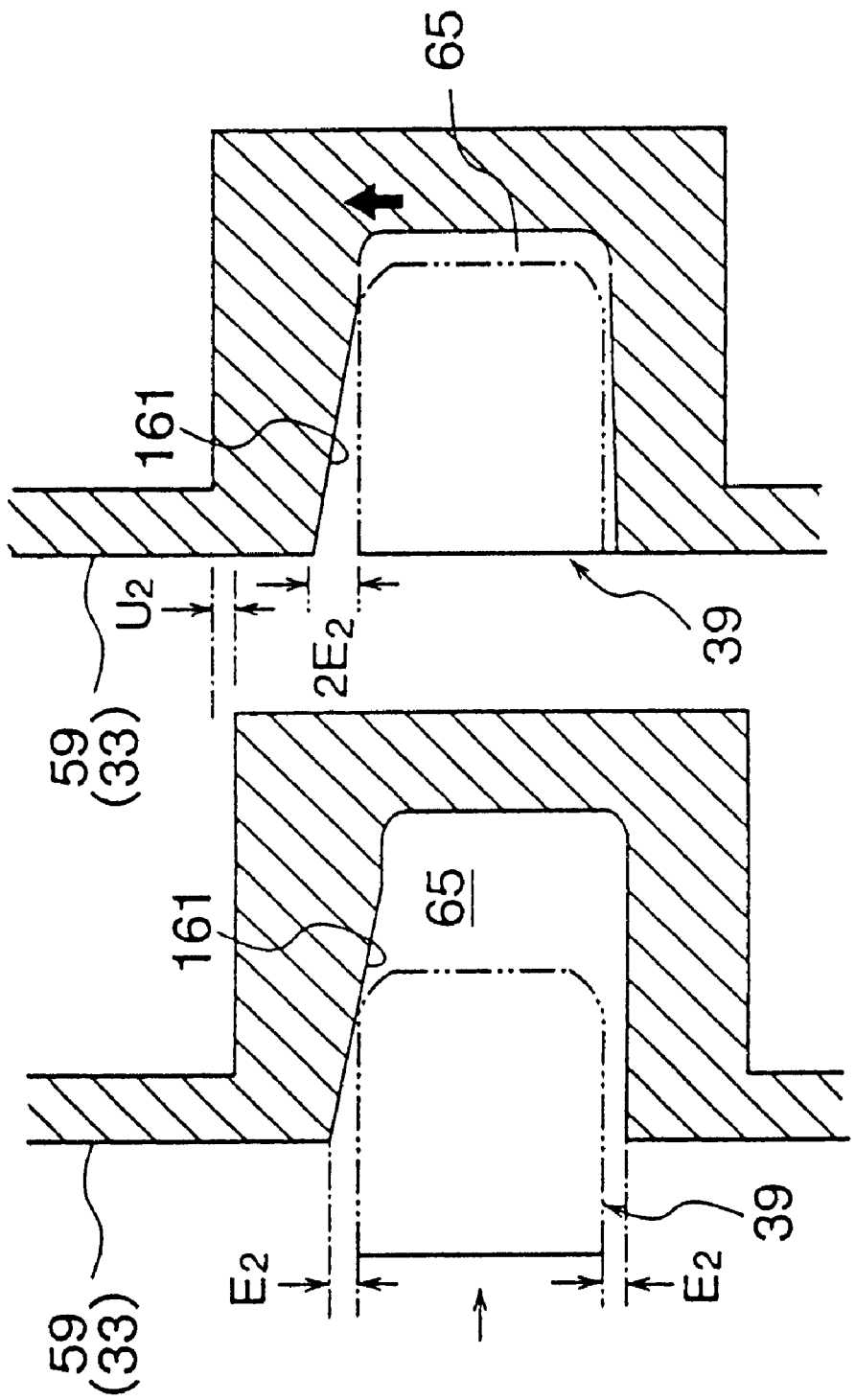

CONTAINER

This application is the U.S. National Phase under 35 U.S.C. §371 of International Application PCT/JP98/05417, filed Dec. 2, 1998.

BACKGROUND OF THE INVENTION

1. Field of the Invention

The present invention relates to a container for receiving and transporting an article such as a substrate necessary to be kept under the condition of high cleanliness during being transported. It is described hereunder in relation to a semiconductor substrate such as a silicon wafer or a liquid crystal substrate, in particular a silicon wafer as an example, however, the present invention is not limited to the above. The present invention is applicable to any article necessary to be kept under the condition of high cleanliness during being transported.

2. Background of the Invention

The semiconductor substrate, in particular silicon wafer is contaminated when dust or vaporized organic compounds (hereinafter simply referred to as "dust") are attached thereto, thus leading to a lower productivity, i.e., the rate of producing a high-quality of product is low. It is therefore necessary to maintain high cleanliness in surrounding environment of the silicon wafer when the silicon wafer is transported. More specifically, the silicon wafer is one of the articles necessary to be kept under the condition of high cleanliness during transported (hereinafter referred to as "dust free article").

In general, the silicon wafer is worked in a room where cleanliness is high (hereinafter referred to as a "high cleanliness room"), i.e., so called a clean room. On the other hand, when the silicon wafer is transported in a room where cleanliness is low, the silicon wafer is received in a hermetically sealed container, the inside of which is kept under the condition of high cleanliness (hereinafter referred to as "container"), and then, the container with the silicon wafer received therein is transported. Thus, the silicon wafer can be transported through a room in which the degree of cleanliness is low or outdoor (hereinafter referred to as "low cleanliness room"), avoiding the silicon wafer from being contaminated during transported.

There is disposed a loader with an opening portion, which can be closed, in the border portion between the high cleanliness room and the low cleanliness room. The silicon wafer is transported through the above loader from the inner space of the container with high cleanliness to the high cleanliness room for working the silicon wafer or the like (hereinafter referred to as "loading"), in addition, from the high cleanliness room to the inner space of the container with high cleanliness for transferring the worked silicon wafer to an another treatment step (hereinafter referred to as "unloading"). More specifically, the silicon wafer is moved through the above opening portion, when loaded and unloaded. The container has a cover (i.e., lid) in a direction to the opening portion of the loader, which cover is opened when the silicon wafer is transferred into or out of the container.

When the silicon wafer is not transported, the opening portion of the loader is kept closed so as to prevent dust from floating into the high cleanliness room from the low cleanliness room. A door may be disposed in the opening portion so that the opening portion can be opened or closed by the door.

In this case, the door may be large enough to completely close the opening portion. In addition, the door may be the size in which the door is about 5 mm smaller in each side than respective side of the opening portion in such manner that there is provided aperture (open space) between the door and the opening portion, while the air pressure in the high cleanliness room is kept higher than that in the low cleanliness room, thus air flows through the aperture from the high cleanliness room to the low cleanliness room.

The following standards for the above container and loader are proposed and applied: SEMI (Semiconductor Equipment and Material International) Standard E47.1 [Box/Pod (FOUP)], E15.1[Tool Load Port], E57[Kinematic Coupling], E62[Front-Opening Interface Standard (FIMS), E63 [Box/Opener to Tool Standard (BOLTS) and the like (hereinafter referred to as "Standard").

RELATED ART

The container with the dust free article received therein is transported in the low cleanliness room by hand or a robot. Then, the container is mounted on a loader disposed in the border portion between the high cleanliness room and the low cleanliness room by hand or a robot. The cover disposed in the frontal surface of the container is opened or closed by an opener mechanism installed in the loader, thus the opening portion of the container is connected to or shut off the high cleanliness room.

A positioning pin and a key are provided in the opener mechanism, and a positioning hole and a key hole are provided in the front side of the container. In opening the cover of the container, the positioning pin is inserted into the positioning hole, and then the key is inserted into the key hole, and then the key is turned so as to operate an lock mechanism installed in the cover of the container in such manner that a lock claw of the lock mechanism is released from a portion to be hooked which is disposed on an edge portion of the container in the opening portion. Then, the opener mechanism is relatively retreated while the positioning pin and the key are kept inserted, thus opening the cover.

However, the above-mentioned operation has not been successfully performed because the scale of the parts in the container vary slightly. More specifically, the opener mechanism which is made of metal and has mechanical construction, i.e., the positioning pin and the key has very small tolerance when manufactured (for example, ±0.01 mm), whereas the body or the cover of the container is made of resin and has a relatively large tolerance when manufactured (for example, at least ±0.5 mm).

Furthermore, since the material of the container has elasticity so as to cause the whole body of the container to be deflected downward, there exist the following problems:

A. The container is deflected against the metal base portion which is directly placed on the loader in such manner that the location of the positioning hole slightly varies to cause the positioning pin to fail to enter into the positioning hole.

B. Even though the positioning pin is successfully inserted into the positioning hole, the key fails to be entered into the key hole. The reason thereof is that the relative relationship of the positioning hole and the key hole changes slightly. More specifically, if the relative relationship thereof changes only 0.4 mm, the key is not successfully inserted into the key hole.

C. The cover which closes the opening portion of the container is dislocated and lowered by the weight thereof, thus further causing the problems described in items A an B above to occur.

In order to overcome the problem described in item A above, (1) the inner diameter of the positioning hole 65 is made larger than the outer diameter of the positioning pin 39 so as to provide a larger play E (refer to FIG. 13). However, If the larger play E is provided, the cover is deflected downward by the same amount as the play E by the weight thereof, when the cover is opened. Accordingly, it is not easy to fittingly close the cover again.

Furthermore, in order to overcome the above-mentioned downward dislocation (i.e., downward movement) of the cover, there is proposed a technique in which a rubber cap 40 is provided around the positioning pin 39 so that the air inside the rubber cap 40 is sucked to be in a reduced pressure so as to support the cover 33, thus preventing the cover from deflecting downward (refer to FIG. 2). However, since the rubber cap 40 also has elasticity, the rubber cap does not satisfactorily function to support the cover.

In addition, in order to overcome the problem described in item A above, (2) chamfering is implemented on an edge of the positioning hole 65, and the amount of play is reduced (refer to FIG. 14), so as to prevent the cover from being lowered when opened. However, the tip portion of the positioning pin 39 is caught by the tapered surface of the chamfering 66 in such manner that the positioning pin is not successfully inserted.

The present invention is made to overcome the above-mentioned problems. The purpose of the invention is to provide a container in which the cover is prevented from being dislocated downward when opened, and the positioning pin as well as the key are successfully inserted into the positioning hole and the key hole respectively, even though the size of the parts in the container slightly varies.

SUMMARY OF THE INVENTION

In order to attain the above object, there is provided a following invention.

There is provided a first invention, which is a container for receiving and transporting dust free articles which is mounted on a loader installed in a border between a high cleanliness room and a low cleanliness room, an opening portion of which is connected to or disconnected from said high cleanliness room by opening and closing of a cover of said container by means of an opener mechanism arranged in said loader, which includes:

(a) a positioning hole provided in a front side of said cover into which a positioning pin of said opener mechanism is inserted; and (b) a tapered surface formed only upper surface of inner portion of said positioning hole for enabling said cover to move slightly upward by means of contacting with said positioning pin.

According to the above-mentioned container, compared to the conventional art in which the larger play of the positioning hole is provided, the cover is opened in a state in which the cover is kept pushed upward by the function of the tapered surface, thus the cover is never dislocated downward. Furthermore, since the tapered surface is formed only on the upper surface of the inner portion of the positioning hole, the cover is surely moved upward in a slight amount, so that the positioning pin is surely inserted without being caught.

There is provided a second invention, which is the container, wherein said positioning hole has a double structure comprising a first hole formed as one unit with said cover in said front side of said cover, and a float received in said first hole in such manner that said float is movable in a slight amount at least vertically, on a front side of which float a second hole is formed into which said positioning pin is practically inserted, with said tapered surface formed on an upper inner surface of said second hole.

According to the above-mentioned container, when the positioning pin is inserted into the second hole of the float, the float contacts with the upper surface 155 of the first hole, and the cover is firmly pushed upward because of the momentum of the proceeding positioning pin. Thus, the positioning pin is prevented from being caught by the upper surface of the second hole.

Furthermore, the float firmly contacts with the upper surface of the first hole so that even if dust is produced by the friction between the float and the upper surface of the first hole, the dust is contained within the first hole, thus preventing the surrounding environment of the container from being contaminated.

In addition, when the cover is in a normal position in a state in which the cover is kept closed, the cover is not pushed upward by the float, and then the cover is dislocated downward in a slight amount when the cover is opened. However, the downward movement of the dislocation is caused only between the float and the first hole, thus the dust produced by the downward movement of the dislocation does not contaminate the surrounding of the container.

There is provided a third invention, which is the container, wherein a key hole portion having a key hole is provided on said front side of said cover into which a key of said opener mechanism is inserted, and a floating mechanism is provided to enable to move said key hole portion in a slight amount along a surface of said cover.

According to the above-mentioned container, even if the relative position of the key and the key hole, as well as the positioning pin and the pin hole vary, the key hole can slightly move by means of the floating mechanism so as to enable the key to be inserted into the key hole. In the present invention, the floating mechanism includes the mechanism using parts having elasticity.

There is provided a fourth invention, which is the container, wherein said floating mechanism has a structure in which a peripheral portion of said key hole portion is supported by a plurality of flat springs bent in J shape.

There is provided a fifth invention, which is the container, wherein said cover includes a lock mechanism for operating to close and open said cover by means of turning said key, and a lock claw of said lock mechanism, which is protruded from a window provided on an edge portion of said cover to engage with an engaged portion provided on an edge portion of said opening portion of said container, an inner flange and an outer flange being formed respectively in inner side and outer side of said edge portion of said opening portion, said engaged portion and a sealed area being disposed in between said inner and outer flanges.

According to the above-mentioned container, even if the dust is produced by the slight upward movement of the cover which causes friction between the engaged portion and the sealed area, the dust can be contained within the inner flange 131 and the outer flange 133.

There is provided a fifth invention, which is the container, wherein a tapered surface is formed on an inner upper surface of said first hole which enable said cover to move upward in a slight amount by means of contacting with said float.

According to the above-mentioned container, since the cover is pushed upward by the contact with the tapered surfaces, the friction is distributed between two tapered surfaces, and the dust produced by the contact between the tapered surface of the first hole can be contained within the float and the first hole.

BRIEF DESCRIPTION OF THE DRAWINGS

FIG. 2 is a conceptional view illustrating a state in which a cover of the container showin in FIG. 1 is not opened as yet.

FIG. 6 is a frontal view illustrating a front surface of the cover.

FIG. 7 is a descriptive view illustrating a lock mechanism.

FIG. 7(A) is a front view of the lock mechanism.

FIG. 7(B) is a vertical sectional view of FIG. 7(A).

FIG. 7(C) is a descriptive view illustrating a state in which a lock claw shown in FIG. 7(B) is disengaged.

FIG. 7(D) a vertical sectional view illustrating a base portion of the cover which is a part of the cover shown in FIG. 7(B).

FIG. 7(E) is a front view illustrating an edge portion of the opening portion of the container.

FIG. 7(F) is a sectional view along F-F line illustrating a guide hole shown in FIG. 7(E).

FIG. 8 is a descriptive view illustrating a seal mechanism of the cover and the opening portion of the container.

FIG. 8(A) is a plan view of the cover in which a horizontal sectional view of the base portion of the cover is shown.

FIG. 8(B) is an enlarged view illustrating an essential portion shown in FIG. 8(A).

FIG. 10 is a descriptive view illustrating construction and function of a positioning hole.

FIG. 10(A) is a sectional view illustrating an initial phase in which the positioning pin is inserted into a second hole.

FIG. 10(B) is a sectional view illustrating a phase in which the insertion is complete.

FIG. 10(C) is a sectional view illustrating a phase in which the cover is lowered when the lock is released after the insertion is complete.

FIG. 10(D) is a descriptive sectional view illustrating a state in which the float relatively pushes the cover upward.

FIG. 11 is a descriptive view illustrating other embodiment of the container of the present invention.

FIG. 11(A) is a sectional view illustrating an initial phase in which the positioning pin is inserted into a second hole.

FIG. 11(B) is a sectional view illustrating a phase in which the insertion is complete.

FIG. 12 is a descriptive view illustrating further other embodiment of the container of the present invention.

FIG. 13 is a descriptive view illustrating conventional container.

FIG. 14 is a descriptive view illustrating another conventional container.

DETAILED DESCRIPTION OF PREFERRED EMBODIMENTS

The best mode of the embodiments of the invention is described with reference to FIGS. 2 to 11. The following embodiments do not limit the scope of the invention. Skilled person in the field can therefore execute other embodiments within a scope of the invention.

Figure 1:
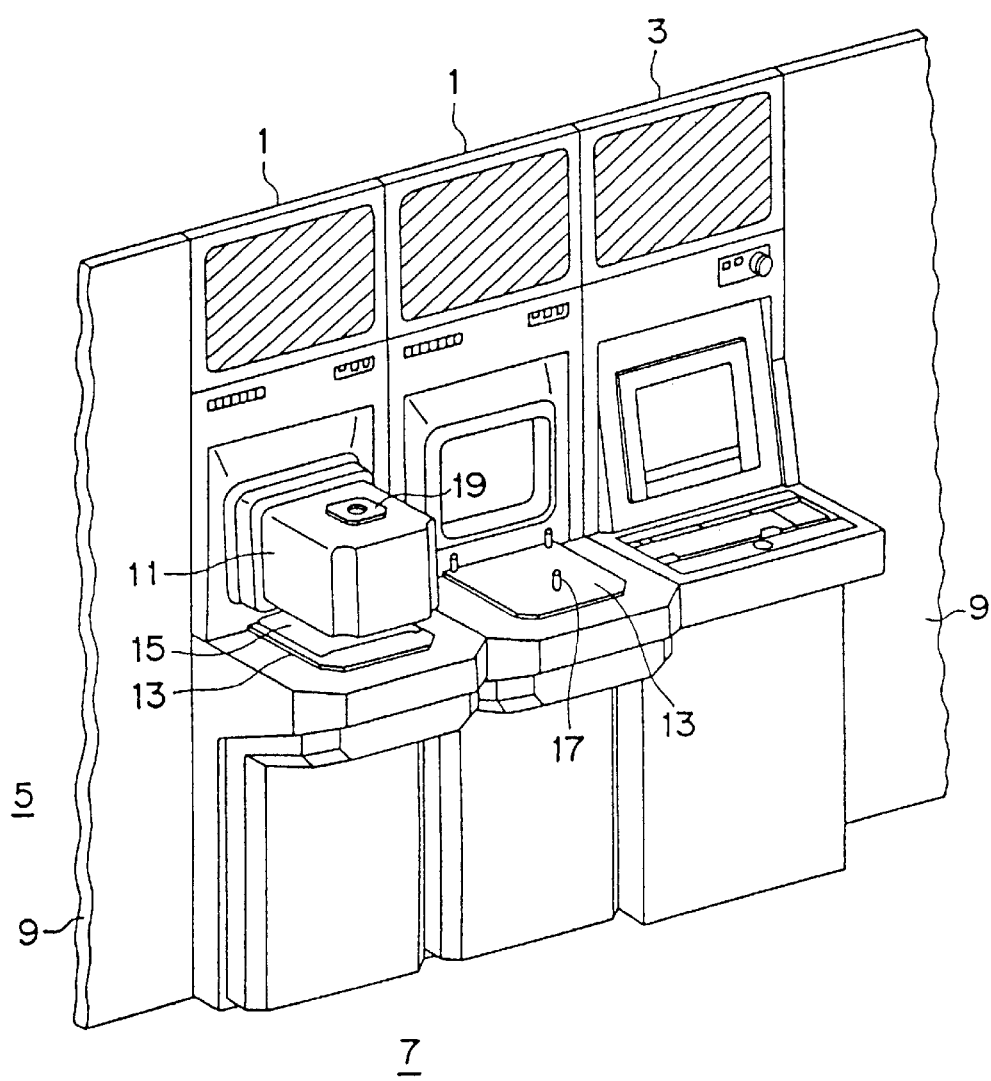
FIG. 1 is a perspective view of a loader with a container of the present invention mounted, which is seen from the low cleanliness room side.
Figure 2A:
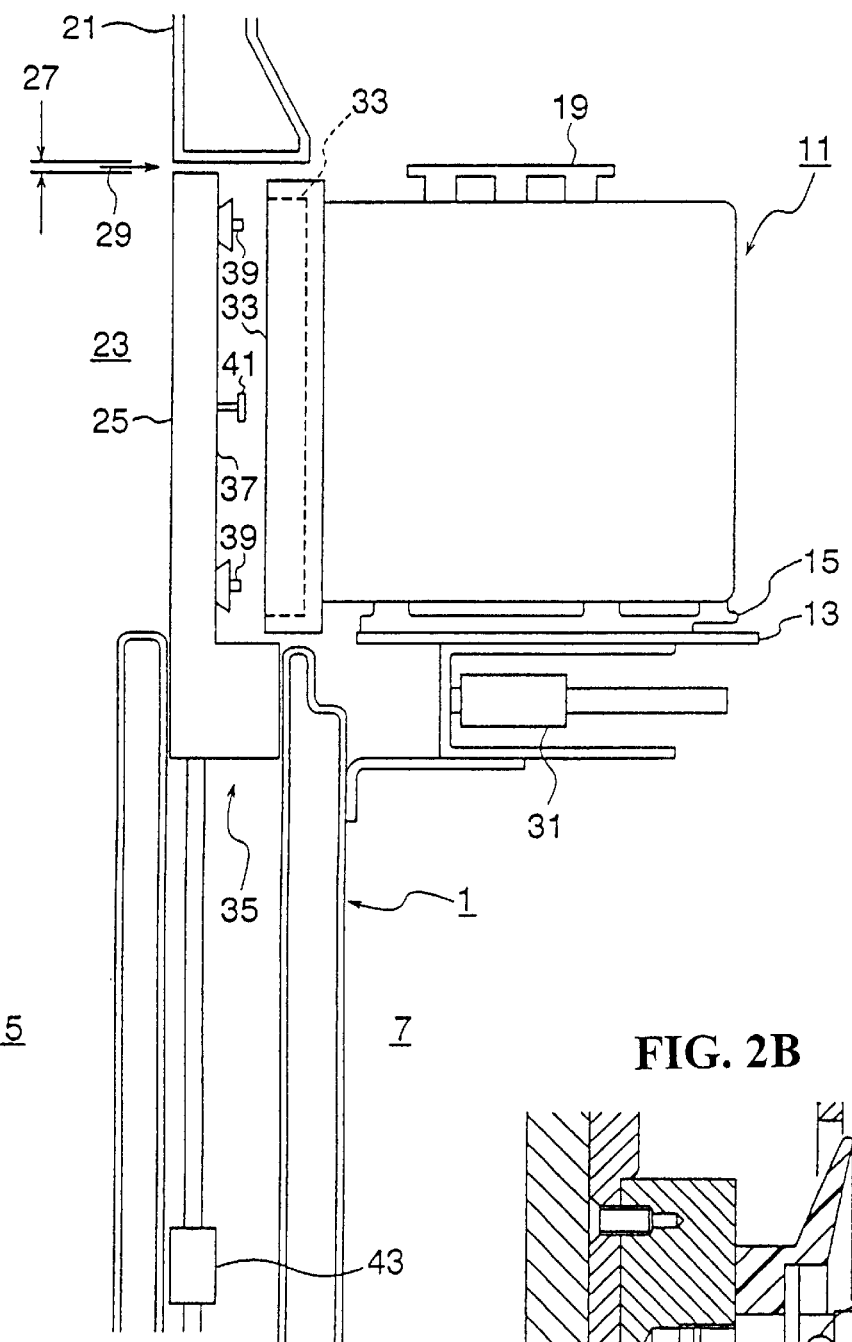
FIG. 2(A) is a vertical sectional view thereof.
Figure 2B:
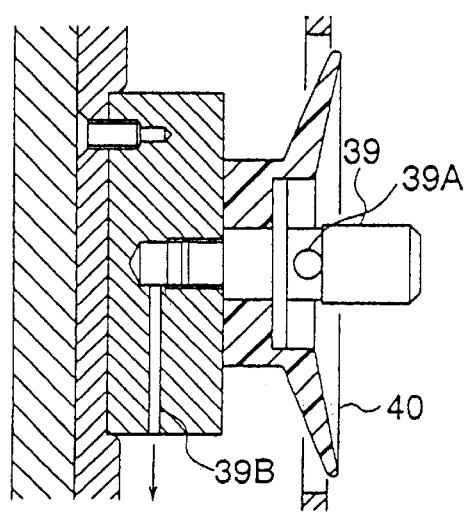
FIG. 2(B) is a vertical sectional view illustrating a rubber cup disposed in a positioning pin.
Figure 3:
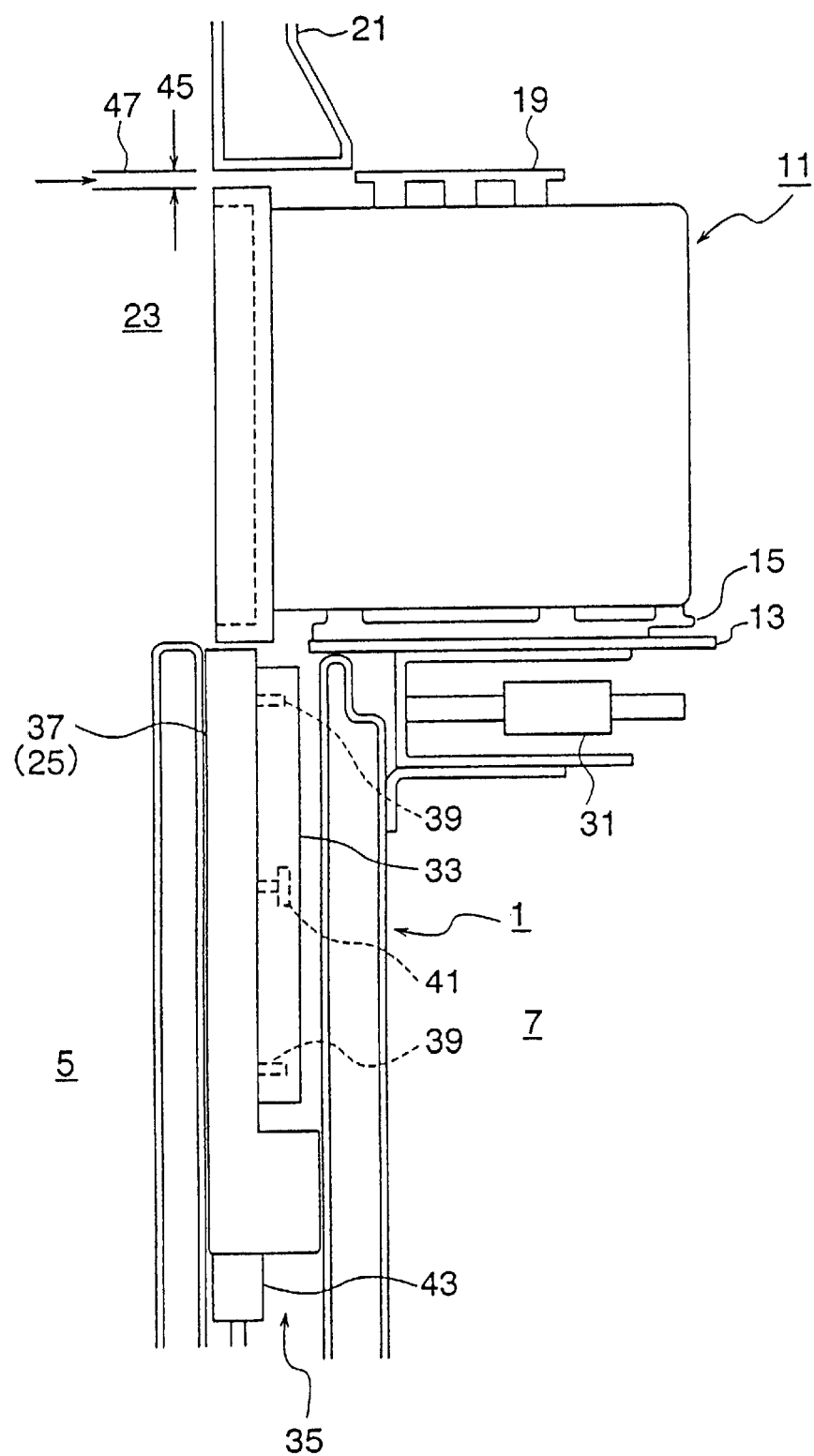
FIG. 3 is a vertical sectional view illustrating a state in which the cover shown in FIG. 2 is opened and an opening portion of the container is connected to a high cleanliness room.

With reference to FIGS. 1, 2 and 3, there is briefly described a process in which the container of the invention is opened and closed by the loader so as to be connected to or disconnected from the high cleanliness room.

As shown in FIG. 1, in this embodiment, two loaders 1 are installed together with a control panel 3 on a wall disposed in the border between a high cleanliness room 5 and a low cleanliness room 7. Either one of the two loaders is assigned, for example, as exclusively used for carrying the silicon wafer into the high cleanliness room, and the other of the loaders is assigned as exclusively used for carrying the silicon wafer out of the high cleanliness room, thus enabling to carrying the silicon wafer in and out of the high cleanliness room in such manner as the so-called conveyer system.

The container 11 is positioned and mounted on the stage 13 of the loader 1. The positioning of the container is carried out by Kinematic Coupling (the reference numeral 17 in FIG. 1 shows a male member thereof) disposed in the stage 13 and the base portion 15 of the container 11.

The container 11 may be mounted by the hands of human being, or the transporting robot installed in the ceiling or the robot mounted on the AGV running on the floor. For this purpose, a flange 19 may be arranged on the upper portion of the container 11. The above-mentioned transportation may be carried out by the use of the process defined in the standard, for example.

The positioning means using Kinematic Coupling may be applied according to the process defined in the standard, for example.

As shown in FIG. 2, a wall opening portion 23 is formed on the wall 21, which is located in front of the corresponding forward portion of the container 11 mounted on the loader 1. The wall opening portion 23 is covered by a door 25 which is called as a closure or the like. The portion between the door 25 and the wall opening portion 23 is not hermetically sealed, but a specific gap 27 is secured. Through the gap 27, the air flow 29 is produced from the high cleanliness room 5 to the low cleanliness room 7 by means of the positive pressure applied to the high cleanliness room 5, thus preventing the dust from infiltrating into the high cleanliness room 5.

Firstly, the stage 13 with the container 11 mounted is moved close to the door 25 by a driving mechanism 31. The door 25 further functions as the opener 37 which is a part of the opener mechanism 35 to open and close the cover 33 located in the front portion of the container 11.

More specifically, a positioning mechanism (the reference numeral 39 is a positioning pin which is a part thereof) is arranged between the surface of the opener 37 in the side of the low cleanliness room 7 and the cover 33 of the container 11 to implement the positioning of the cover 33 and the opener 37.

As shown in FIG. 2(B), the positioning pin 39 is arranged in the center portion of a hemispherical rubber cap 40, which is to be attached to the front surface of the cover by adsorption, when the positioning pin is inserted into the positioning hole. More specifically, the air within the rubber cap 40 is sucked through the suction port 39A formed on a portion located inside of the rubber cap 40 of the positioning pin 39, and sent to a vacuum pump (not shown) existed outside of the system through a air passage 39B. Thus, the cover 33 is sustained and fixed by means of negative pressure in the rubber cap 40.

Then, a key 41 arranged on the opener mechanism 37 is inserted into a key hole arranged on the cover 33 of the container in the state that the above-mentioned sustaining and fixing are kept, and the key is turned to operate a lock mechanism installed inside of the cover 33, thus releasing an engagement of a lock claw of the lock mechanism with an engaged portion disposed on the edge portion of the opening portion of the container 11.

Then, the stage with the container mounted moves backward in the state that the cover 33 is kept fixed onto the opener 37. By this backward movement, the cover 33 is removed from the container 11, thus the opening portion of the container 11 is opened.

Then, the opener 37 with the cover 33 fixed is lowered into the inside of the loader 1 by means of the driving mechanism 43 installed in the opener mechanism 35. Then, the stage with the container 11 moves forward again. By this forward movement, the opening portion of the container 11 is connected to the high cleanliness room through the wall opening portion 23 formed on the wall 21 (refer to FIG. 3). Thus, a prescribed gap 45 is formed between the opening portion of the container 11 and the wall opening portion 23 of the wall 21. The air stream 47 is produced through the gap 45 from the high cleanliness room to the low cleanliness room, thus preventing the dust in the low cleanliness room from infiltrating into the high cleanliness room.

The silicon wafer as the dust free article is carried into the high cleanliness room 5 from the container 11 connected to the high cleanliness room, and then a prescribed working is applied thereto. After being worked, the silicon wafer may be carried out of the high cleanliness room into a container mounted on another loader, or the same container 11 mounted on the same loader 1. The carrying out and in of the silicon wafer may be implemented by a known method such as a scalar type robot used in the clean room installed within the high cleanliness room 5.

When the silicon wafer is carried out of the high cleanliness room into the container 11, the reverse process of the process taken in the carrying same into the high cleanliness room is applied. More specifically, the stage 13 with the container 11 mounted moves backward, then the opener 37 with the cover 33 fixed is lifted upward by the driving mechanism 43 in the opener mechanism 35. Then, the stage 13 moves slightly forward to cover the opening portion of the container by the cover 33. Then, the key 41 of the opener 37 I reversely turned to cause the lock claw of the lock mechanism to engage with the engaged portion, thus being locked to hermetically close the opening portion of the container 11 by the cover 33. Then, after the fixing means of the opener 37 releases the cover 33 which was fixed, the stage moves slightly backward, thus enabling to transport the container 11 in the low cleanliness room 7.

(Construction of the container)

Constructions of the container of the present invention is described with reference to FIGS. 4 to 10.

(General)

Figure 4:
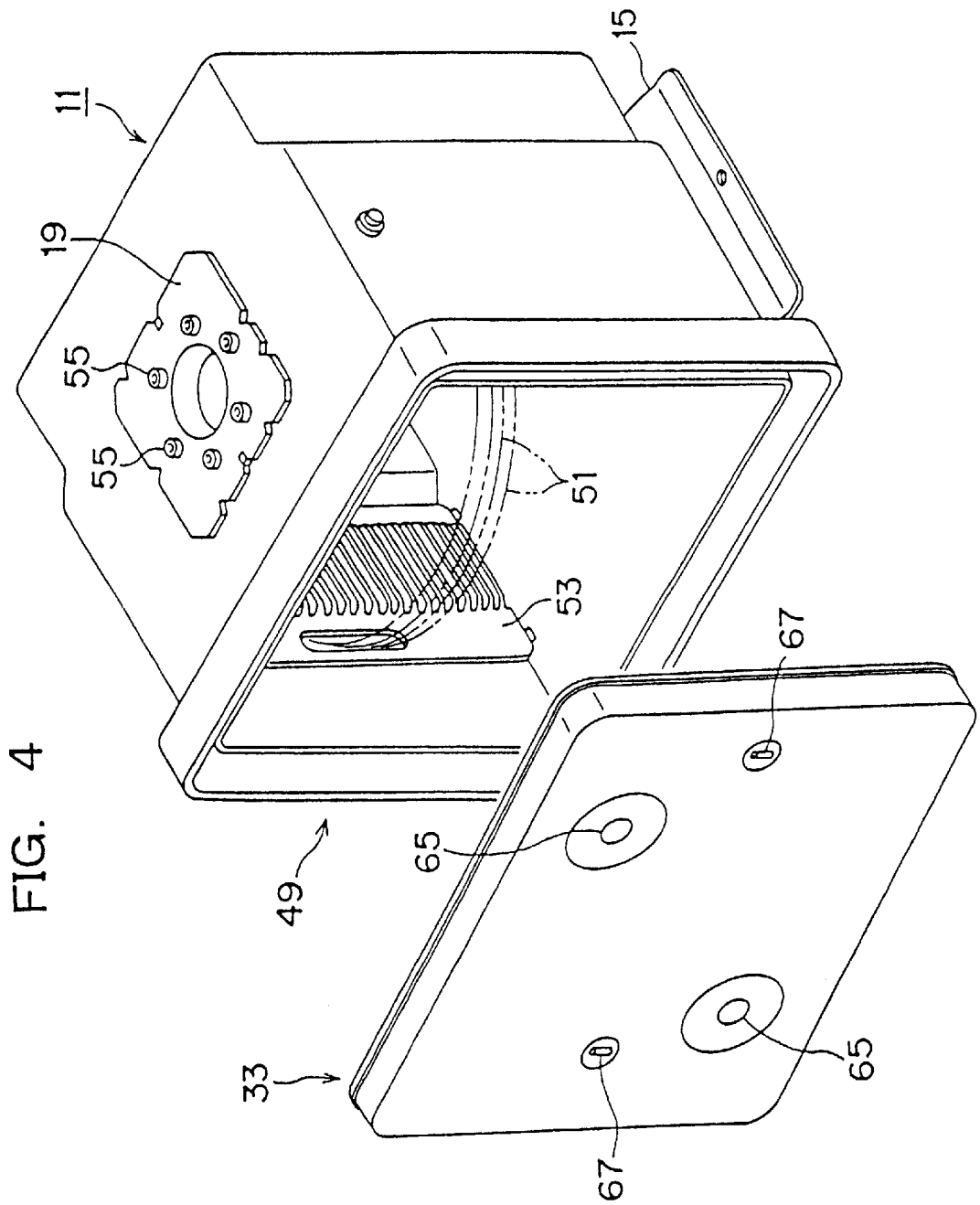
FIG. 4 is a perspective view illustrating a container as a whole of the present invention.

As shown in FIG. 4, the container of this embodiment has a box type shape, and the square opening portion 49 is formed in the front side of the container. Interior of the container 11 has a space to receive the silicon wafer as the dust free article. There are attached on the right side and left side inner walls as well as the back side inner wall the parts called as a teeth 53 and a stopper 54 to horizontally support a plurality of silicon wafers in a state in which the wafers are kept parallel each other (refer to FIG. 5).

The flange 19 which is snatched by the transporting robot installed in the ceiling is attached on the upper outer surface of the container by a plurality of screws 55, in such manner that the flange is in parallel to the upper surface of the container with a prescribed clearance therebetween. The base portion 15 is attached to the lower outer surface of the container. There is arranged the Kinematic Coupling on the base portion 15 to position the container to the stage 13 of the loader 1 (refer to FIG. 1). More specifically, the female member 57 having V shaped groove to receive the male member 17 (refer to FIG. 1) having a rod shaped protrusion is arranged on the base portion 15 (refer to FIG. 5), which male member is a part of the Kinematic Coupling. The male members 57 and the female members 17 are arranged on three places. The straight lines extending through the respective V shaped grooves cross at the center of the base portion 15. By this arrangement of the male and female members, the precise positioning is implemented.

Figure 5:
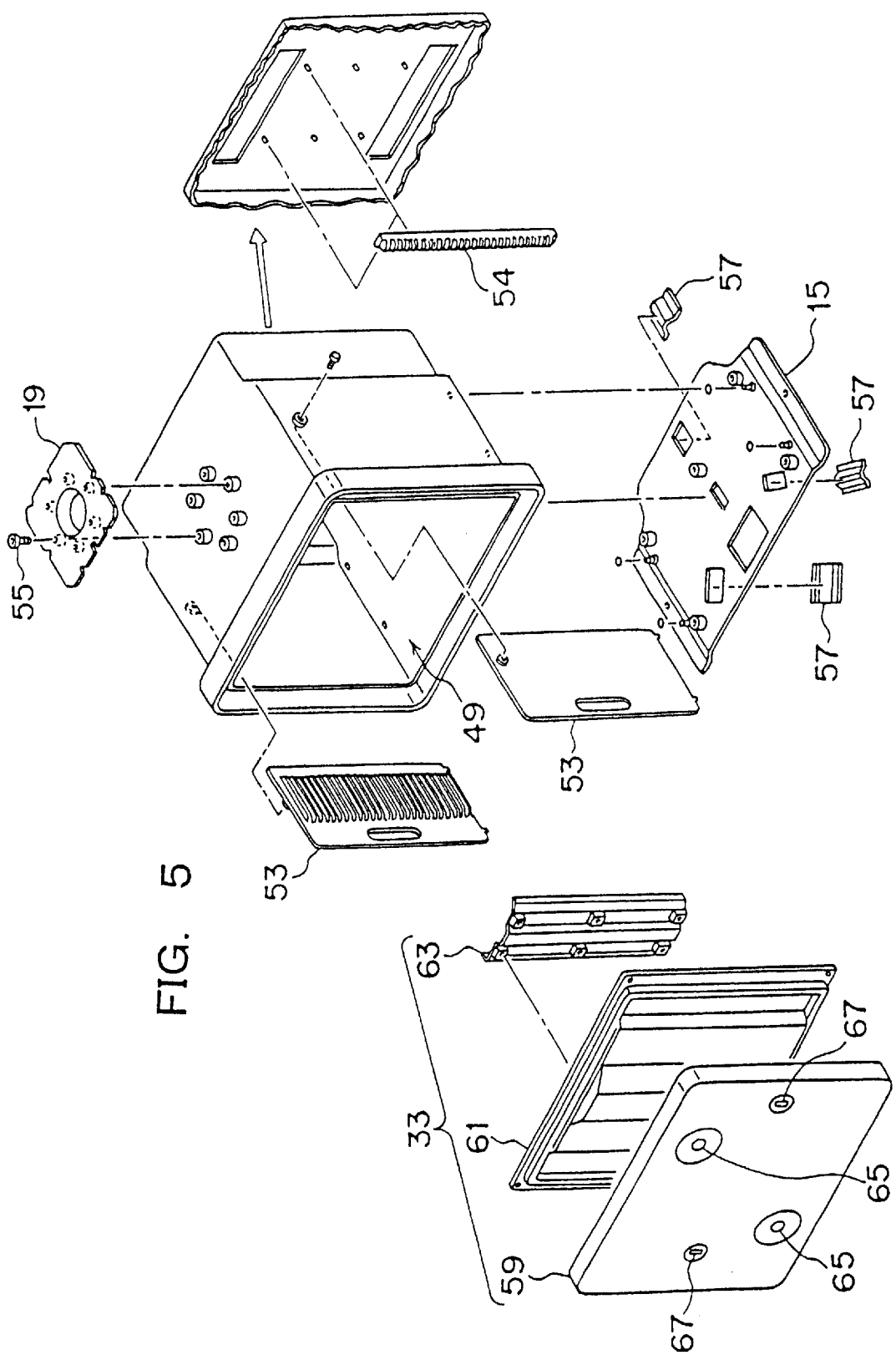
FIG. 5 is a perspective view illustrating a disassembled container shown in FIG. 4.

The cover 33 for opening and closing the opening portion 49 has a double construction comprising the cover body 59 in the outside thereof and the cover base 61 in the inside thereof (refer to FIG. 5). There is further arranged a front securing member 63 to secure the wafers on the inner side of the cover base 61 (refer to FIG. 5), thus enabling to transport the plurality of silicon wafers received in the container in a state in which the plurality of silicon wafers are supported in parallel each other, and secured.

As shown in FIG. 6, the positioning holes 65 are disposed on the upper right side and lower left side of the front surface of the cover 33. There are further disposed the key holes in the left side and the right side on the cover. When larger distances between the two positioning holes 65 in the vertical direction and the horizontal direction are selected, the cover 33 may be stably supported by the inserted positioning pins 39 in the opener mechanism 35. When the keys 41 inserted into the key holes 67 are turned, the lock mechanism is operated to release the locking. Then, the opener mechanism 35 relatively moves backward so as to remove the cover.

(Lock mechanism)

Figure 9:
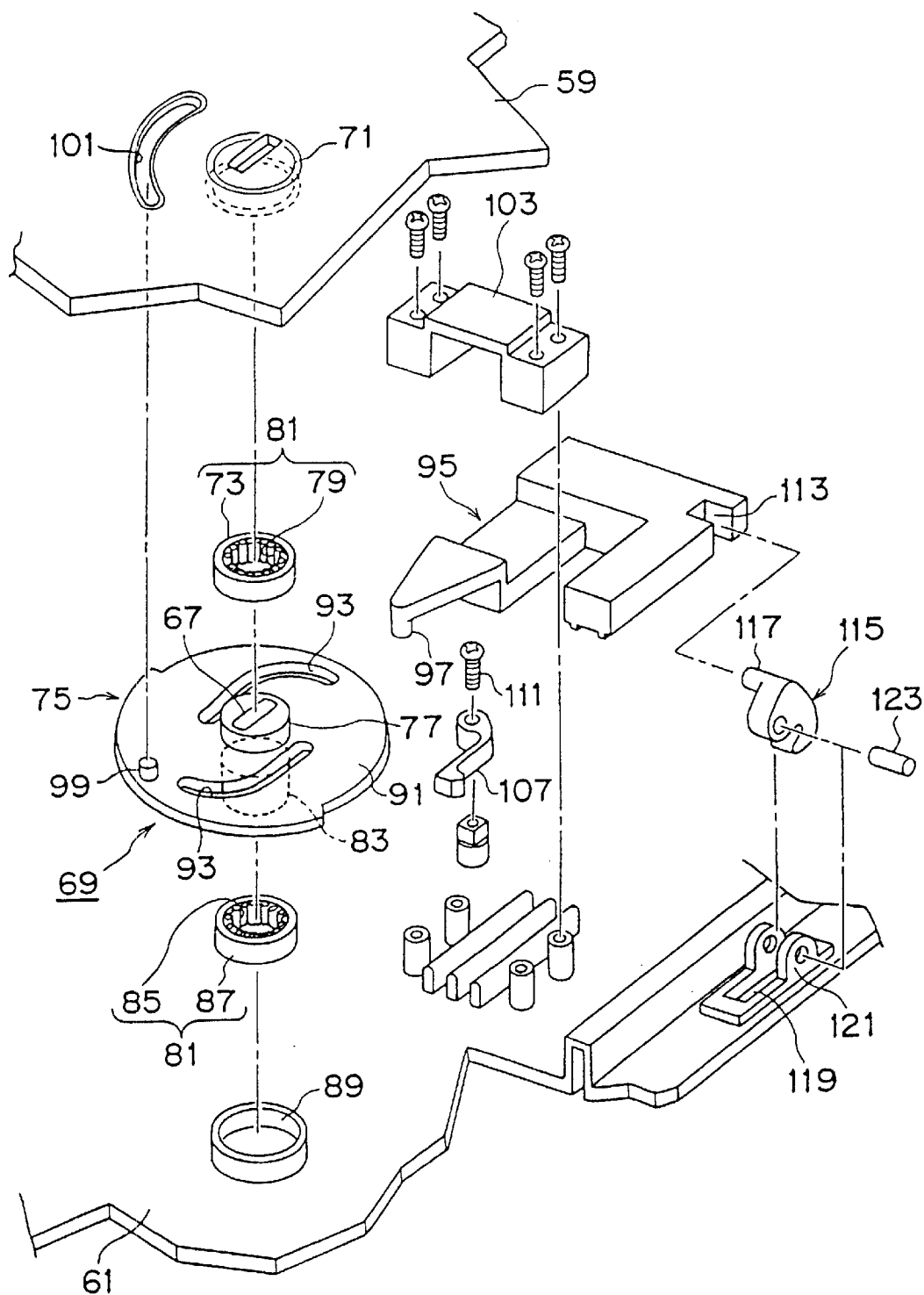
FIG. 9 is a perspective view illustrating disassembled lock mechanism shown in FIGS. 7(A)(B).

As shown in FIGS. 7 and 9, the lock mechanism 69 is arranged in the space between the cover body 59 of the cover 33 and the cover base 61 of the cover 33 (refer to FIG. 7(B)).

The lock mechanism in relation to the right side key hole 67 is described with reference to FIGS. 7 and 9 in detail. The cylindrical sleeve 73 is fitted into the inside of the cylindrical window portion 71 formed on the cover body 59 of the cover 33. The cylindrical member 77 disposed on the upper surface of the cam 75 is inserted into the sleeve 73, thus supported. Many flat springs 79 are installed on the inner peripheral surface of the sleeve 73. The flat springs 79 are bent in a reverse J shape. The cylindrical member 77 of the cam 75 is supported by the round bent portions of the flat springs. By the above-mentioned mechanism, the floating mechanism 81 is provided in such manner that the cam 75 can be moved in a slight amount in the directions to upper and lower ward, as well as right and left ward. The rectangular key hole 67 is formed on the end surface of the cylindrical member 77 which is exposed out of the cylindrical window portion 71. The edge of the key hole 67 is chamfered in such manner that the key is easily inserted without being caught.

The same type of the cylindrical member 83 is disposed on the lower side of the cam 75, and the cylindrical member 83 is supported through the same type of sleeve 87 having many flat springs 85 by the cylindrical support member 89 disposed on the cover base 61 of the cover 33. The floating mechanism 81 comprises the flat springs 85 and the sleeve 87.

Two cam grooves 93 are formed in the disk portion 91 of the cam 75 in symmetry in relation to the center of the disk portion 91. The round engaging tip portion 97 of the slider 95 is engaged with each of the cam groove 93. Due to the shape of the cam groove 93, when the cam revolves, the slider 95 slides in the either direction close to the cam 75, or away from the cam 75. The guide pin 99 is formed on the upper and lower surfaces of the disk portion 91, respectively. The guide pin is inserted into the guide groove 101 formed in the cover body 59 and the cover base 61 of the cover 33, thus stabilizing the revolving movement. The slider 95 is sustained by the slider fixer 103 so as to be reciprocally slidable in only one direction. The ratchet mechanism 109 comprising the claw groove 105 (refer to FIG. 7(A)), and the claw 107 is disposed on the side surface of the slider 95, thus the sliding action of the slider 95 is controlled to control the locked state and unlocked state. More specifically, two claw grooves are formed on the side surface of the slider 95, and each claw groove corresponds to either the locked state or the unlocked state. The claw 107 engaged with the claw groove 105 are pivotably movable around the revolving axis 111.

On one of the side surfaces of the slider 95 which faces toward the edge portion of the cover 33, the recessed portion 113 is formed, and the lever 117 of the lock claw 115 is sustained therein. The lock claw 115 is disposed to face the window 119 formed on the cover base 61 of the cover 33, and pivotably disposed around the revolving axis 123 supported by supporting portion 121 formed on the edge portion of the window 119 (refer to FIG. 9).

When the cover 33 is closed, the window 119 contacts with the engaged hole 125 formed on the edge portion 50 of the opening portion 49 of the container 11 (refer to FIG. 7(C)). A small protruding portion 127 is formed on the edge portion of the side of the engaged hole 125. Thus, the engaged portion 129 comprises the engaged hole 125 and the engaged protruding portion 127.

As described above, when the slider 95 is pulled by the cam 75 and slides in the direction coming near, the lock claw 115 is pulled by the lever 117 and turns, thus the tip of the lock claw 115 is withdrawn from the window 119. In the reverse movement, the tip of the lock claw 117 is thrust out of the window 119 to engage the engaged portion 129 formed on the edge portion of the opening portion 49 of the container 11.

(Cover and sealing construction of the opening portion)

The sealing mechanism to hermetically seal the opening portion 49 of the container by the cover 33 is shown in FIG. 8.

The inner flange 131 and the outer flange 133 are formed all along the peripheral edge portion 50 of the opening portion 49 of the container 11, and the engaged portion 129 is formed between the inner flange and the outer flange. Corresponding to the inner flange 131, the flange receptive recess portion 135 is formed on the cover base of the cover 33. Small gap (not shown) is formed between the flange receptive recess portion 135 and the inner flange 131 in such manner that the cover 33 can be slightly moved by about 1 mm in the horizontal and vertical direction. The O-ring groove 139 in which the O-ring 137 is fitted for sealing is formed just outer side of the flange receptive recess portion 135. The O-ring and the portion to which the O-ring contacts is called as a sealing area 141.

As shown in FIGS. 7(D), (E), (F), the guide protrusion 143 is formed on the center portions in both right and left ends of the cover base 61 of the cover 33, and the guide port 145 into which the guide protrusion is inserted is formed on the edge portion 50 of the opening portion 49 of the container 11. The small gap (about 1 mm) is positively formed between the guide protrusion and the guide port 145 in such manner that the cover can slightly move upward. By this slight movement, the friction occurs between the opening portion 49 and the edge portion 50 in the sealing area 141, however, the dust produced by the above-mentioned friction is contained between the inner flange 131 and the outer flange 133. The contained dust is carried away by the air flow caused by the pressure difference from the backside of the guide port 145 to the low cleanliness room, thus contamination in the interior of the container 11 and the high cleanliness room 5 can be prevented from occurring.

(Positioning hole)

Then, the construction of the positioning hole 65 is described with reference to FIGS. 6 and 10.

The positioning hole has a double construction comprising the first hole (i.e., receiving hole) 151 and the float 153. The first hole 151 is formed on the surface portion of the cover body 59 of the cover 33. The first hole 151 has a bag shape in the sectional area, and is formed as one unit with the cover body 59. The first hole extends in the depth in such manner that the float 153 is received therein. When the float 153 is received in the first hole 151, there exists a gap S between the upper outer surface of the float 153 and the inner upper surface of the first hole 151, which gap enable the float 153 to slightly move at least vertically. The second hole (i.e., insertion hole) 156 is formed on the front side of the float into which the positioning pin 39 is practically inserted. The tapered surface 157 is formed on the upper surface of the second hole 156 to the prescribed extent in the direction of the depth thereof. Furthermore, the inclined surface 159 having the same angle as that of the tapered surface 157 is formed on the upper side of the edge portion of the first hole 151.

(Opening and closing operation)

The opening and closing operation of the cover 33 is implemented as follows, in the above embodiment.

When the cover 33 is to be opened (i.e., removed), the container 11 moves forward to the opener mechanism 35, and the positioning pin 39 of the opener mechanism 35 is inserted into the positioning hole 65 disposed on the cover 33 of the container 11. More specifically, the tip of the positioning pin 39 is inserted into the second hole 156 of the float 153. When the tip of the positioning pin 39 contacts with the tapered surface 157 of the float 153 and proceeds, the float 153 moves slightly upward. Then, the gap S between the upper inner surface of the first hole 151 and the upper outer surface of the float 153 vanishes, i.e., the upper outer surface of the float 153 directly and fully contacts with the upper inner surface of the first hole 151, thus the positioning pin 39 supports the cover 33 through the first hole 151. In this case, If the cover 33 is dislocated downward in the initial stage in which the cover 33 is closed, the cover 33 is pushed upward to move slightly as described above, thus the cover 33 returns to the normal position.

In this state, the keys 41 are inserted into the respective key hole 67. Since the edge of the key hole 67 is chamfered, when the positions of the key 41 and the key hole 67 are not identical, the tip of the key 41 contacts with the chamfered surface of the key hole 67, and the key hole 67 moves in a slight amount along the angle of the chamfered surface by the floating mechanism 81, thus the positions of the key 41 and the key hole 67 come to identical, and the key 41 is inserted into the key hole 67.

Then, when the key 41 is turned, the key hole 67 and the cam 75 revolves, and the slider 95 is pulled to turn the lock claw 115, thus the lock claw is disengaged from the engaged portion 129. The container 11 moves backward with the lock claw disengaged, the cover 33 supported by the positioning pins of the opener mechanism 35 moves away the opening portion of the container, thus the cover is removed from the container.

When the cover 33 is to be closed, the container 11 moves forward to close the opening portion 49 by the cover 33 under the condition in which the positioning pin 39 of the opener mechanism 35 supports the cover 33, and the keys are inserted into the respective key holes 67. Then, when the key is turned in the reverse direction, the key hole 67 and the cam 75 revolve in reverse direction to push the slider 95 in such manner that the lock claw 115 revolves in reverse direction to engage with the engaged portion 129, thus the container is hermetically sealed. When the container moves backward, the positioning pins 39 are pulled out of the positioning holes 65, and the keys are pulled out of the respective key holes 67.

(Detailed description of the function of the tapered surface of the positioning hole)

As shown in FIG. 10(A), there are respective plays (i.e., clearance) E11 and E12 between the upper edge of the fist hole 151 and the upper outer surface of the positioning pin 39, and between the lower edge of the first hole 151 and the lower outer surface of the positioning pin 39. When the cover 33 is in the normal position, i.e., not lowered, both of the plays are designed to be equal, i.e., $$E11 = E12 \quad (1)$$

and the gap S is provided between the upper outer surface 154 of the float 153 and the inner upper surface 155 of the first hole 151. When the gap is smaller than the plays, the float does not fully move, and fails to function. On the other hand, when the gap is larger than the plays, the float moves, however, fails to fully function to push up the cover 33. Accordingly, it is preferable to nearly have the following relationship:

$$E11 + E12 = S \quad$$

As shown in FIG. 10(B), when the positioning pin 39 is fully inserted into the second hole 156 of the float 153, the gap a1S exists between inner upper surface of the first hole 151 and the upper outer surface of the float 153, and the gap a2S exists between inner lower surface of the first hole 151 and the lower outer surface of the float 153. Accordingly, $$a1 + a2 = 1 \quad (a1, a2 \text{ are positive coefficient}) \quad (3)$$

However, when the cover 33 is in the normal position from the beginning, the relationship thereof becomes as follows:

$$a1 = a2 = 0.5 \quad (4)$$

When the lock claw 115 is disengaged under the above-mentioned condition, and the cover 33 is opened, the cover 33 is dislocated downward by a slight amount of D1. In this case, it becomes as follows:

$$D1 = a2S \quad (5)$$

Therefore, the following is introduced from formulae (2) and (4):

$$D1 = 0.5(E11 + E12) \quad (5\text{-}2)$$

If the float is not provided (refer to FIG. 10(D) at all, the cover is lowered by a slight amount Dc. On the other hand, $$Dc = E11 \quad (6)$$

When the cover 33 is dislocated downward from the beginning, it clearly shows as follows:

$$E11 < E12 \quad (7)$$

Accordingly, from the formulae (5), (6) and (7), it becomes as follows:

$$Dc > D1 \quad (8)$$

As a result, it can be said that the cover 33 is pushed upward by the float 153 by Dc−D1.

Figure 13A:
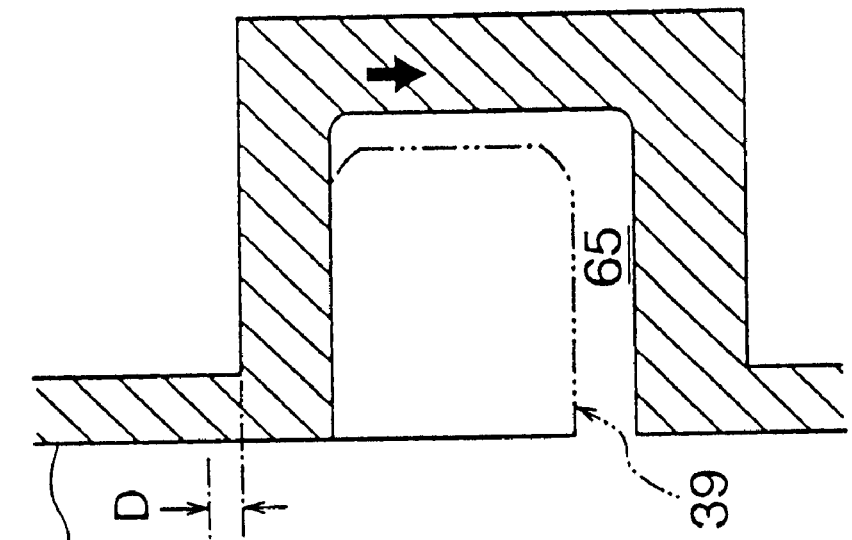
FIG. 13(A) is a sectional view illustrating an initial phase in which the positioning pin is inserted.
Figure 13B:
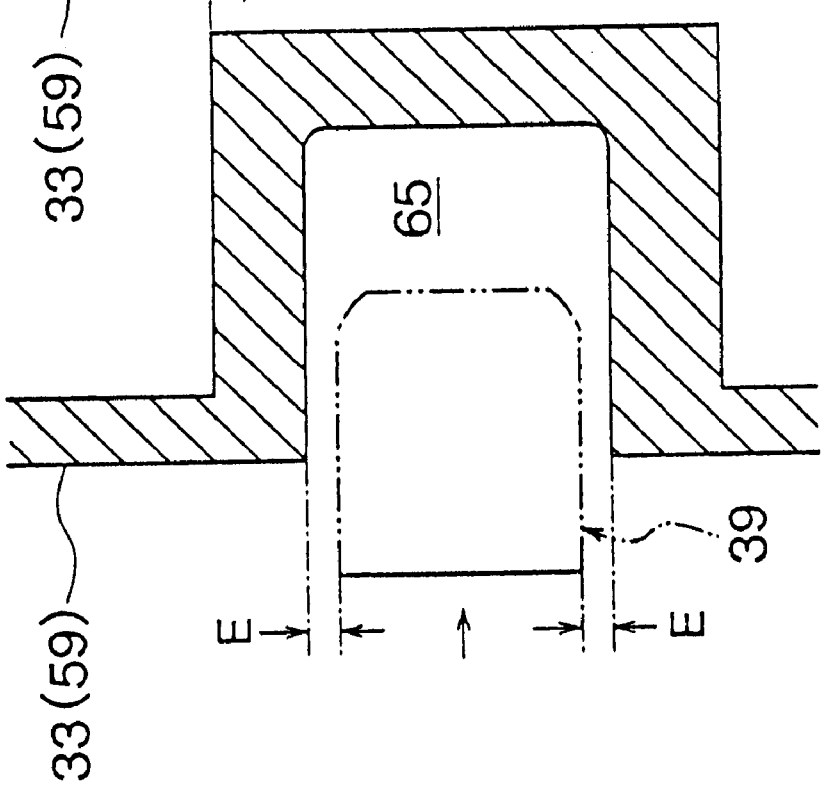
FIG. 13(B) is a sectional view illustrating a state in which the insertion is complete and the cover is dislocated.

On the other hand, as shown in FIG. 13 which relates to the conventional art, if the respective plays E exist between the positioning pin 39 and the positioning hole 65, the slight amount D which is the amount the cover 33 is dislocated downward after being opened becomes as follows:

$$D = E \quad (9)$$

On this occasion, since the tapered surface is not formed, it must be the following to be inserted:

$$E > E11, E12 \quad (11)$$

Accordingly, from the formulae (2), (5-2) and (9), it becomes the following:

$$D > D1$$

(Effect)

The following effects are obtained by the above construction and function:

(1) Since the cover 33 is supported by the positioning pins 39, the cover 33 is prevented from being dislocated downward by the weight thereof. Accordingly, the opening portion 49 can be smoothly closed by the cover.

(2) When the positioning pin 39 is inserted into the second hole 156 of the float 153, the positioning pin 39 and the float 153 proceed in the direction of the insertion by momentum. Therefore, when the flaot 153 contacts with the inner upper surface of the first hole 151, the cover 33 is firmly pushed up through the first hole 151.

By this momentum, the positioning pin 39 is prevented from being caught on the tapered surface 157 and halted on the way.

(3) Since the tapered surface 157 is formed only on the inner upper surface in the second hole 156 of the float 153, the cover 33 is slightly moved upward so that the insertion is surely implemented without being caught.

(4) The float 153 firmly contacts with the inner upper surface 155 of the first hole 151. Even if the dust is produced by the above firm contact, the dust is contained in the area between the float 153 and the first hole 151, thus preventing the surrounding environment from being contaminated.

(5) When the cover 33 is closed and stays in the normal position, the cover 33 is not pushed up by the float 153 (refer to FIG. 10(B)). Furthermore, when the cover 33 is opened, the cover is slightly lowered (refer to FIG. 10C)). This downward movement occurs between the float 153 and the first hole 151, thus the dust produced by the above movement does not contaminate the surrounding environment.

Therefore, according to the present invention, in comparison with the prior art shown in FIG. 13, the following effects can be obtained. More specifically, when the cover 33 is in the state of being dislocated downward at the initial stage of the closing, the cover 33 is opened in the state that the cover is kept pushed up. Therefore, the cover 33 is not dislocated downward at all. On the other hand, when the cover 33 is in the state of normal position at the initial stage of the closing, the cover 33 is slightly lowered when the cover 33 is opened. However, the dust produced by the lower movement is contained within a space between the float 153 and the first hole 151, thus preventing contamination.

Figure 14A:
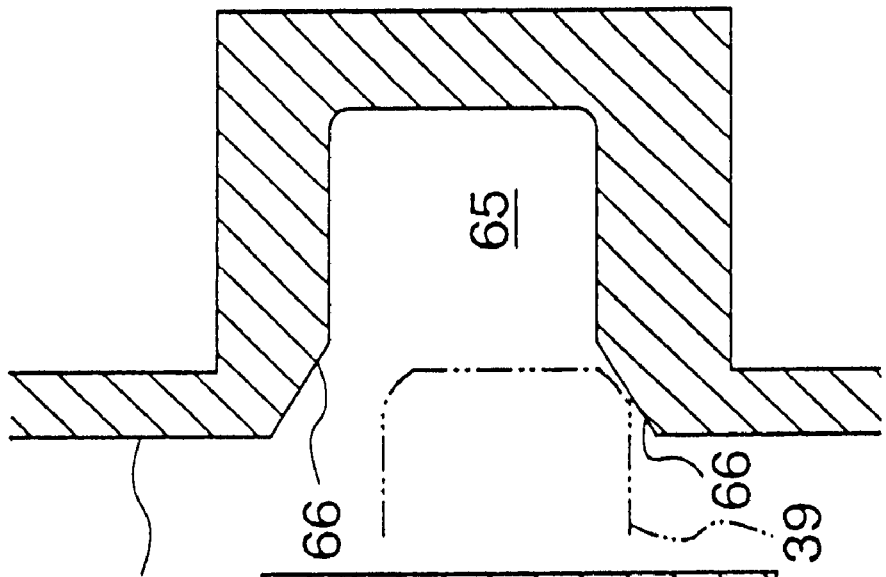
FIG. 14(A) is a sectional view illustrating a state in which the dislocation is not produced between the positioning pin and the positioning hole.
Figure 14B:
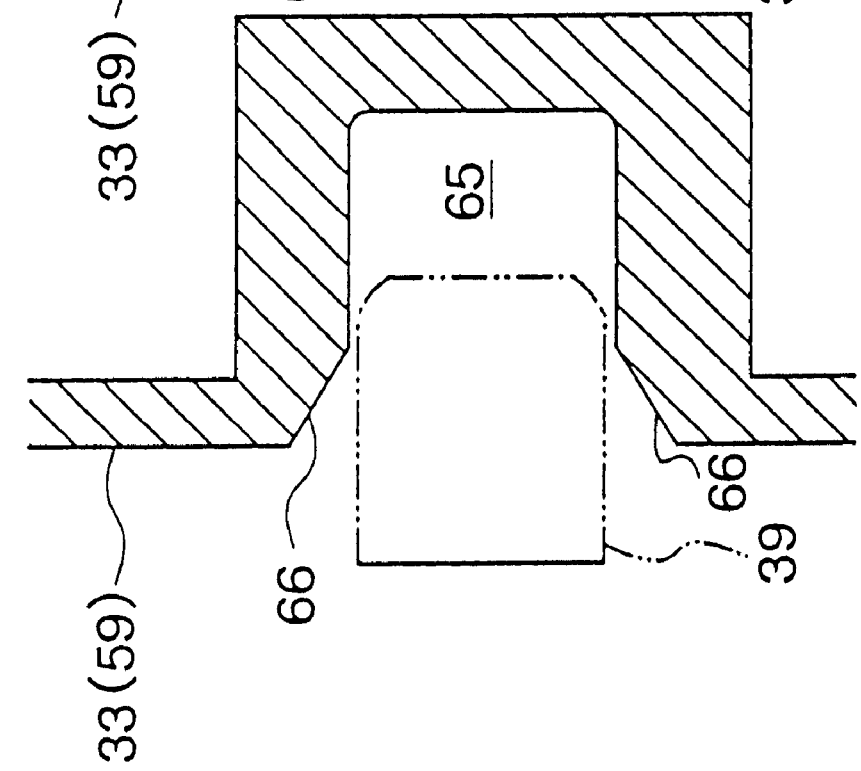
FIG. 14(B) is a sectional view illustrating a state in which the positioning hole is upwardly dislocated.

Furthermore, according to the present invention, in comparison with the prior art shown in FIG. 14, the following effects can be obtained. More specifically, since the cover 33 can be firmly pushed up, the positioning pin is prevented from being caught on the tapered surface and halted on the way. Even if the dust is produced by the above firm contact, the dust is contained in the area between the float 153 and the first hole 151, thus preventing the surrounding environment from being contaminated. Furthermore, when the cover 33 is closed and stays in the normal position, and the cover 33 is opened, the cover is slightly lowered. The dust produced by the above downward movement is contained within a space between the float 153 and the first hole 151, and does not contaminate the surrounding environment. Furthermore, the cover 33 is surely slightly moved upward so that the insertion is surely implemented without being caught.

(Other embodiment)

In the above embodiment, the positioning hole 65 has the double construction including the float 153. In other embodiment of the invention, for example as shown in FIG. 11, the positioning hole 65 may have a tapered surface 161 on the inner upper surface of the positioning hole without having a double construction.

In this case, when the plays in the upper side and the lower side of the positioning pin 39 in the positioning hole 65 are E2 respectively, the amount of U2, which is a slight upward movement the cover 33 is pushed up, is equal to E2. Thus, when the cover 33 is opened, the cover 33 is not lowered.

In addition, since the tapered surface 161 is formed only upper inner surface of the positioning hole 65, the cover 33 is surely moved upward, thus the insertion is surely implemented without being caught on the way.

On the contrary, when the tapered surfaces are formed on both of the upper inner surface and the lower inner surface, for example the prior art as shown in FIG. 14, in which the edges of the positioning hole 65 are chamfered to form the tapered surfaces 66, the positioning pin is caught on the way because the cover 33 is not moved downward when the positioning pin contacts with the lower inner surface of the tapered surface.

Figures 12A, 12B, 12C:
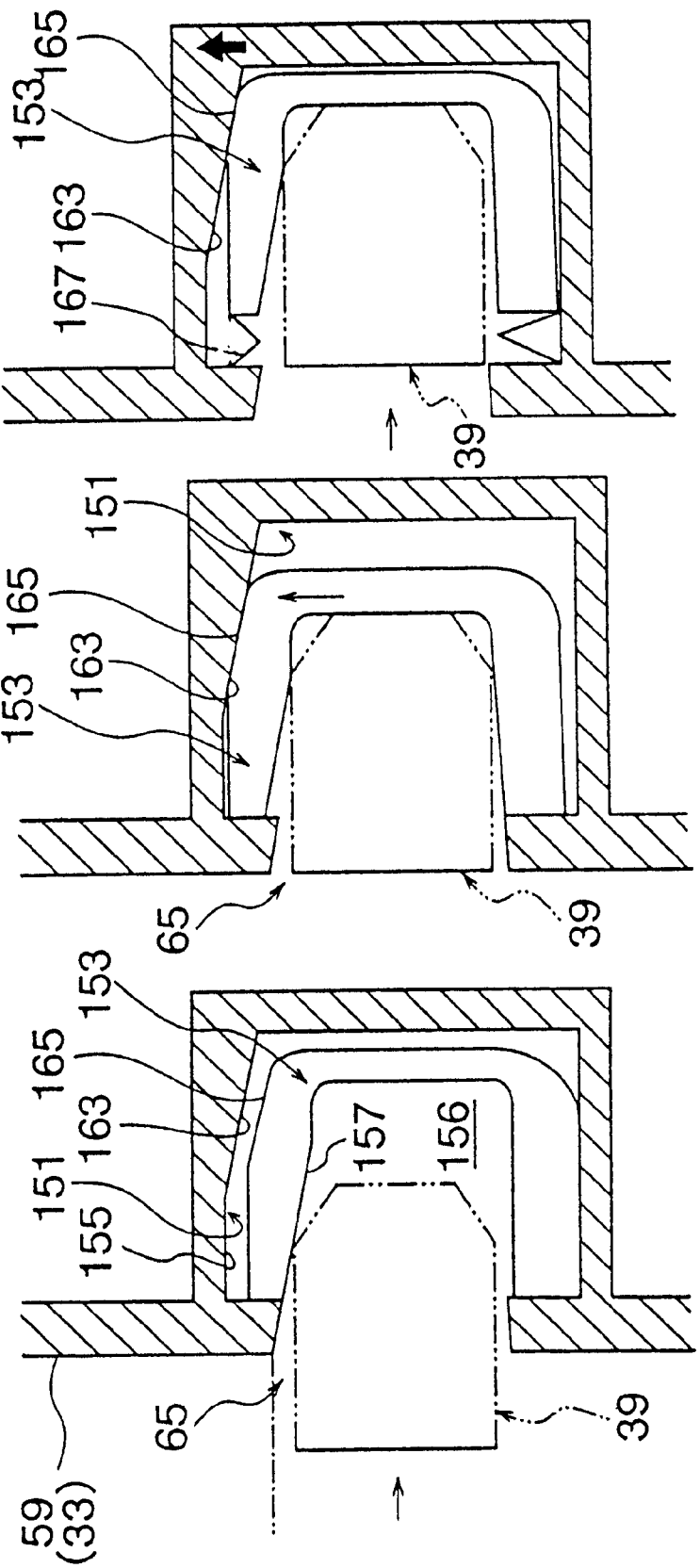
FIG. 12(A) is a sectional view illustrating an initial phase in which the positioning pin is inserted into a second hole.
FIG. 12(B) is a sectional view illustrating a phase in which the insertion is in process.
FIG. 12(C) is a sectional view illustrating a phase in which the insertion is complete.

Although a tapered surface is not formed on the upper inner surface 155 of the first hole 151 in the above embodiment, a tapered surface 163 may be formed on the upper inner surface 155 of the first hole 151, for example as shown in FIG. 12. By this construction, when the float 153 contacts with the tapered surface 163, the cover 33 may be further slightly moved upward.

In this case, the positioning pin 39 contacts with the float 153 at the tapered surface 157, and the float contacts with the first hole 151 at the tapered surface 163, thus the power of the friction is distributed into the above two contact points. Accordingly, the dust produced by the friction between the float 153 and the first hole 151 is contained within a space between the float 153 and the first hole 151. Furthermore, the amount of the dust produced by the friction between the positioning pin 39 and the float 153 can be reduced in comparison with that in FIG. 10, because the power of the friction is distributed as described above, thus preventing the contamination by the dust.

Furthermore, when the angle of the tapered surface 157 which is formed on the inner upper surface of the float is reduced, most of the friction may be caused on the float 153 and the tapered surface 163 of the first hole. By this construction, most of the dust produced by the friction may be contained within a space between the float 153 and the first hole 151.

In particular, when the angle of the tapered surface 157 which is formed on the inner upper surface of the float 153 becomes almost zero, further larger effect may be obtained.

In addition, a further tapered surface 165 may be formed on the float 153, which corresponds to the tapered surface 163 of the inner upper surface of the first hole 151, as shown in FIG. 12.

Furthermore, a tapered surface is not formed on the positioning pin 39 which contacts which the tapered surface 157 in the embodiment shown in FIG. 10, thus the positioning pin 39 contacts with the float at point. However, the tapered surface corresponding to the tapered surface 157 may be formed on the positioning pin 39, thus the positioning pin 39 contacts with the float by wide area to reduce the production of the dust.

A flexible cover 167, for example bellows type, may be disposed between the edge portion of the second hole 156 of the float 153 and the inner side of the edge portion of the first hole 151 to stem the dust contained in the space between the float 153 and the first hole 151, thus enabling to perfectly contain the dust in the embodiment as shown in FIG. 12.

Furthermore, although the key hole 67 includes the floating mechanism 81 in the above-described embodiment, the key hole does not necessarily include the floating mechanism. Material having sufficient expansion and contraction in vertical and horizontal may be used. When the size of the key hole 7 and the positioning hole 65 is sufficiently precise, it is not necessary to include the floating mechanism.

The lock claw 115 rotates to protrude in arc from the window 119 formed on the back side of the cover base 61 of the cover 33 and engage with the engaged portion 129 in the above described embodiment. The lock claw 115 may protrude or retreat in straight from the port formed on the side of the edge of the cover 33 horizontally or vertically to engage with the engaged portion.

As described above, according to the present invention, when the positioning pin and the key of the opener mechanism is inserted into the positioning hole and the key hole disposed in the container for receiving and transporting the dust free article such as semiconductor wafer to open and close the cover, the insertion may be easily implemented and the cover may be smoothly closed.

The dust free article received in and transported by the container of the invention is not limited to the silicon wafer. Semiconductor substrate such as liquid crystal base, and articles in the medical field may be used.

What is claimed is:

1. A container for receiving and transporting dust free articles which is mounted on a loader installed in a border between a high cleanliness room and a low cleanliness room, an opening portion of which is connected to or disconnected from said high cleanliness room by opening and closing of a cover of said container by means of an opener mechanism arranged in said loader, which includes:
   (a) a positioning hole provided in a front side of said cover into which a positioning pin of said opener mechanism is inserted; and
   (b) a tapered surface formed only upper surface of inner portion of said positioning hole for enabling said cover to move slightly upward by means of contacting with said positioning pin.

2. The container as claimed in claim 1, wherein said positioning hole has a double structure comprising a first hole formed as one unit with said cover in said front side of said cover, and a float received in said first hole in such manner that said float is movable in a slight amount at least vertically, on a front side of which float a second hole is formed into which said positioning pin is practically inserted, with said tapered surface formed on an upper inner surface of said second hole.

3. The container as claimed in claim 1, wherein a key hole portion having a key hole is provided on said front side of said cover into which a key of said opener mechanism is inserted, and a floating mechanism is provided to enable to move said key hole portion in a slight amount along a surface of said cover.

4. The container as claimed in claim 3, wherein said floating mechanism has a structure in which a peripheral portion of said key hole portion is supported by a plurality of flat springs bent in J shape.

5. The container as claimed in claim 1, wherein said cover includes a lock mechanism for operating to close and open said cover by means of turning a key, and a lock claw of said lock mechanism, which is protruded from a window provided on an edge portion of said cover to engage with an engaged portion provided on an edge portion of said opening portion of said container, an inner flange and an outer flange being formed respectively in inner side and outer side of said edge portion of said opening portion, said engaged portion and a sealed area being disposed in between said inner and outer flanges.

6. The container as claimed in claim 2, wherein a tapered surface is formed on an inner upper surface of said first hole which enable said cover to move upward in a slight amount by means of contacting with said float.

7. The container as claimed in claim 2, wherein a key hole portion having a key hole is provided on said front side of said cover into which a key of said opener mechanism is inserted, and a floating mechanism is provided to enable to move said key hole portion in a slight amount along a surface of said cover.

8. The container as claimed in claim 2, wherein said cover includes a lock mechanism for operating to close and open said cover by means of turning a key, and a lock claw of said lock mechanism, which is protruded from a window provided on an edge portion of said cover to engage with an engaged portion provided on an edge portion of said opening portion of said container, an inner flange and an outer flange being formed respectively in inner side and outer side of said edge portion of said opening portion, said engaged portion and a sealed area being disposed in between said inner and outer flanges.

9. The container as claimed in claim 3, wherein said cover includes a lock mechanism for operating to close and open said cover by means of turning said key, and a lock claw of said lock mechanism, which is protruded from a window provided on an edge portion of said cover to engage with an engaged portion provided on an edge portion of said opening portion of said container, an inner flange and an outer flange being formed respectively in inner side and outer side of said edge portion of said opening portion, said engaged portion and a sealed area being disposed in between said inner and outer flanges.

10. The container as claimed in claim 4, wherein said cover includes a lock mechanism for operating to close and open said cover by means of turning said key, and a lock claw of said lock mechanism, which is protruded from a window provided on an edge portion of said cover to engage with an engaged portion provided on an edge portion of said opening portion of said container, an inner flange and an outer flange being formed respectively in inner side and outer side of said edge portion of said opening portion, said engaged portion and a sealed area being disposed in between said inner and outer flanges.

11. A container for receiving and transporting dust-free articles, having a detachable cover on a side of the container, said cover adapted to be connected to a door disposed in an opening of a boundary wall between a high cleanliness room and a low cleanliness room wherein said container is adapted to be placed on a loader in the low cleanliness room to connect the cover to the door, said cover having at least one positioning hole in its front surface, each positioning hole receiving a positioning pin provided on the door to properly position the cover with respect to the door before opening or closing the cover by opening or closing the door to load the article to or unload the article from the container through the opening, said positioning hole formed by a recess for receiving the positioning pin, said recess having an opening and an upper inner surface tapered inwardly from the opening so that when inserting the positioning pin into the recess, the end of the positioning pin contacts the tapered surface and pushes upward the recess to position the cover in a predetermined position.

12. The container according to claim 11, wherein said positioning hole has structures comprising (i) an opening through which the positioning pin is inserted, (ii) a float forming the recess; and (iii) a restrainer for restraining upward movement of the float.

13. The container according to claim 12, wherein said cover further has a key hole through which a key is inserted to lock or unlock the cover after positioning the cover in the predetermined position.

* * * * *